United States Patent

Oppermann et al.

(10) Patent No.: US 9,815,146 B2
(45) Date of Patent: Nov. 14, 2017

(54) PASTE FOR JOINING COMPONENTS OF ELECTRONIC MODULES, SYSTEM AND METHOD FOR APPLYING THE PASTE

(75) Inventors: Hermann Oppermann, Berlin (DE); Matthias Hutter, Berlin (DE); Christian Ehrhardt, Berlin (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 641 days.

(21) Appl. No.: 14/001,486

(22) PCT Filed: Feb. 28, 2012

(86) PCT No.: PCT/EP2012/000978
§ 371 (c)(1),
(2), (4) Date: Dec. 3, 2013

(87) PCT Pub. No.: WO2012/116846
PCT Pub. Date: Sep. 7, 2012

(65) Prior Publication Data
US 2014/0079472 A1 Mar. 20, 2014

(30) Foreign Application Priority Data
Feb. 28, 2011 (DE) .......... 10 2011 013 172

(51) Int. Cl.
*B23K 35/26* (2006.01)
*B23K 35/30* (2006.01)
(Continued)

(52) U.S. Cl.
CPC ........ *B23K 35/025* (2013.01); *B23K 35/0244* (2013.01); *B23K 35/26* (2013.01);
(Continued)

(58) Field of Classification Search
CPC .. B23K 35/0244; B23K 35/025; B23K 35/26; B23K 35/262; B23K 35/264;
(Continued)

(56) References Cited

U.S. PATENT DOCUMENTS 4,214,903 A * 7/1980 Murabayashi .......... C22C 12/00
376/206
4,740,252 A * 4/1988 Hasegawa ............ B23K 35/025
148/24

(Continued)

FOREIGN PATENT DOCUMENTS

EP 1837119 A1 9/2007
JP S56-94796 A 7/1981
(Continued)

OTHER PUBLICATIONS

English translation of the Written Opinion of the International Search Report mailed Jul. 3, 2012 for PCT/EP2012/000978; 5 pages.*

(Continued)

*Primary Examiner* — Helene Klemanski
(74) *Attorney, Agent, or Firm* — Studebaker & Brackett PC

(57) ABSTRACT

The invention relates to a paste, preferably for joining components of power electronics modules, the paste comprising a solder powder, a metal powder and a binder, wherein the binder binds solder powder and metal powder before a first heating. According to the invention, the binder is free of flux or is a flux having only low activation. In this way, a joining layer which exhibits only few included voids and good mechanical and electrical stability can be provided between a first and a second component.

16 Claims, 1 Drawing Sheet

(51) Int. Cl.
*B23K 35/36* (2006.01)
*B23K 35/362* (2006.01)
*B23K 35/02* (2006.01)
*B23K 35/32* (2006.01)
*H01L 23/00* (2006.01)

(52) U.S. Cl.
CPC .......... *B23K 35/262* (2013.01); *B23K 35/264* (2013.01); *B23K 35/302* (2013.01); *B23K 35/3006* (2013.01); *B23K 35/3013* (2013.01); *B23K 35/3033* (2013.01); *B23K 35/322* (2013.01); *B23K 35/362* (2013.01); *B23K 35/3612* (2013.01); *B23K 35/3613* (2013.01); *H01L 24/29* (2013.01); *H01L 24/32* (2013.01); *H01L 2224/29294* (2013.01); *H01L 2224/29309* (2013.01); *H01L 2224/29311* (2013.01); *H01L 2224/29318* (2013.01); *H01L 2224/29339* (2013.01); *H01L 2224/29344* (2013.01); *H01L 2224/29347* (2013.01); *H01L 2224/29355* (2013.01); *H01L 2224/29364* (2013.01); *H01L 2224/29369* (2013.01); *H01L 2224/29499* (2013.01); *H01L 2224/32507* (2013.01); *H01L 2924/00013* (2013.01); *H01L 2924/01029* (2013.01); *H01L 2924/01327* (2013.01); *H01L 2924/13055* (2013.01); *H01L 2924/15787* (2013.01); *Y10T 403/479* (2015.01)

(58) Field of Classification Search
CPC ............ B23K 35/3006; B23K 35/3013; B23K 35/302; B23K 35/3033; B23K 35/322; B23K 35/3612; B23K 35/3613; B23K 35/362; H01L 24/29; H01L 24/32; H01L 2224/29309; H01L 2224/29311; H01L 2224/29313; H01L 2224/29339; H01L 2224/29344; H01L 2224/29347; H01L 2224/29355; H01L 2224/29364; H01L 2224/29369; H01L 2224/29099; H01L 2224/32507; H01L 2924/13055
USPC ...................... 75/230, 255; 148/24; 403/272; 228/248.1
See application file for complete search history.

(56) References Cited

U.S. PATENT DOCUMENTS

| | | | | |
|---|---|---|---|---|
| 4,960,236 | A | * | 10/1990 | Hedges ................ B23K 35/262 148/24 |
| 4,995,921 | A | * | 2/1991 | Davis ................. B23K 35/3612 148/22 |
| 5,928,404 | A | * | 7/1999 | Paruchuri ............ B23K 35/025 75/255 |
| 5,976,628 | A | * | 11/1999 | Kawahara ......... H01L 23/49883 257/E23.075 |
| 6,195,248 | B1 | * | 2/2001 | Kunishi ................. H01C 1/142 361/305 |
| 6,235,996 | B1 | * | 5/2001 | Farooq ............... H01L 21/4853 174/257 |
| 6,373,000 | B2 | * | 4/2002 | Nakamura ............... H05K 3/34 174/261 |
| 7,017,795 | B2 | * | 3/2006 | Liu ...................... B23K 35/025 148/23 |
| 8,388,724 | B2 | * | 3/2013 | Kato .................. B23K 35/0244 75/255 |
| 8,920,580 | B2 | * | 12/2014 | Takaoka ............. B23K 35/0244 75/255 |
| 2002/0012608 | A1 | * | 1/2002 | Takaoka ............... B23K 35/264 420/561 |
| 2003/0066681 | A1 | * | 4/2003 | Uchida .............. B23K 35/0244 174/260 |
| 2005/0056687 | A1 | * | 3/2005 | Matsumoto .......... B23K 35/025 228/248.1 |
| 2007/0245852 | A1 | | 10/2007 | Takaoka et al. |
| 2010/0096043 | A1 | | 4/2010 | McCluskey et al. |

FOREIGN PATENT DOCUMENTS

| | | |
|---|---|---|
| JP | S63-168293 A | 7/1988 |
| JP | H02-194632 A | 8/1990 |
| JP | 2003-211289 A | 7/2003 |
| JP | 2010-516478 A | 5/2010 |
| WO | 2008/091825 A1 | 7/2008 |

OTHER PUBLICATIONS

Mesh and Micron Sizes; Industrial Specialties Mfg. and IS Med Specialties (ISM); 2014-2015, no month available; 1 page.*
Derwent Abstract of JP 63/168293, Jul. 1988; 2 pages.*
English translation of JP 2003/211298, Jul. 2003; 19 pages.*
International Search Report; PCT/EP2012/000978; Jul. 3, 2012.

* cited by examiner

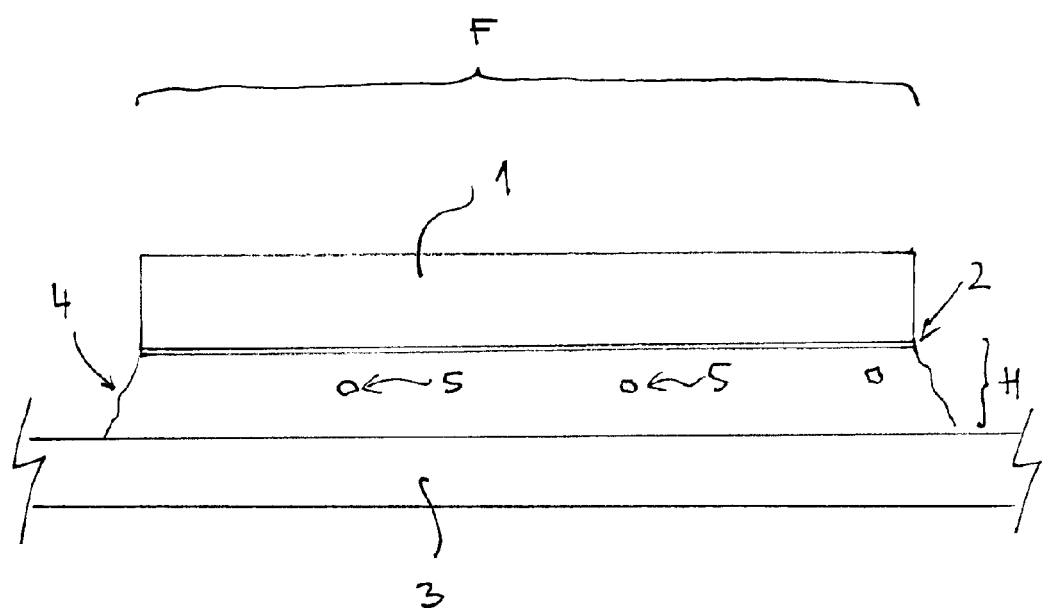

PASTE FOR JOINING COMPONENTS OF ELECTRONIC MODULES, SYSTEM AND METHOD FOR APPLYING THE PASTE

The present invention relates to a paste, preferably for joining components of electronic modules, said paste comprising a solder powder, a metal powder and a binder, wherein the solder powder and the metal powder binds before a heating process, and to the use of a paste for joining power modules, and to a method for joining components of electric modules with the aid of a paste as described above.

In the case of modules in power electronics, extremely good thermal transfers between power semiconductors and substrate and also between substrate and base plate are required in order to dissipate the waste heat and to keep the temperature increase low. During operation of the power semiconductor, loads occurs both as a result of temperature changes and due to permanent switching cycles. In the case of soldered joints however, these loads lead to early failure as a result of fatigue.

In the field of high-temperature electronics, the ambient conditions are above 160° C. and temperatures of 200 or even 300° C. are reached depending on the application. Only few conventional lead-free soft solders can be used up to 160° C. however. In addition, the solders cannot be subject to greater mechanical load since the creep rate rises sharply and, with load changes, a high accumulated creep strain is quickly reached, which likewise leads to failure as a result of fatigue.

Since lead-rich solders have been prohibited, lead-free soft solders are used as standard as a joint between the semiconductor and the substrate and also to the base plate, but fail as a result of fatigue after short to medium loading. One possibility for solving this problem is to adapt the dimensioning of the power semiconductor, that is to say the power modules are not operated with the maximum possible power.

Further possibilities for solving the problem provide the use of sintered silver, which is characterized by an increased fatigue strength. However, the material price of silver and the process capability constitute disadvantages in the implementation of this solution. A further method, which has already been known for a long time, is the use of gold-rich solders (AuSn, AuGe, AuSi or AuIn), which, besides the high melting point, are also much harder than the soft solders. Due to the high price of gold, this method constitutes a heavy economical burden however.

A further variant is transient liquid phase bonding, in which, once the solder has been melted, it is further reacted with metals having a high melting point and converts into intermetallic phases having a higher melting point. This occurs during the soldering process (also referred to as isothermal or "chemical" hardening) or also by subsequent tempering after the hardening of the solder as a result of diffusion processes. There are two basic variations in the case of transient liquid phase bonding:

a) The metal having a high melting point is provided as a metal layer by the join partners, that is to say the joining points between the substrate and the power semiconductor or the substrate and the base plate. The solder wets the metal layer, etches it and converts parts thereof into intermetallic phases. In the prior art, only thin intermetallic layers can be produced in this way, since the diffusion processes otherwise would lead to very high temperatures and extremely long diffusion times.

b) The metal having a high melting point is admixed as powder to the solder powder and, as the solder melts, the metal powder is wetted by the solder, etched and converted into intermetallic phases. In this variant, thicker joining layers can be produced compared to variant (a), that is to say even non-uniform joint gaps between the various modules can be filled.

Although variant b) constitutes an improvement, it is associated with the problem that the solder wets the metal powder, whereby intermetallic phases are produced immediately however that fix the metal powder particles to the contact points. The molten solder is not sufficient however to fill the gaps between the metal powder particles. A large number of relatively large cavities are thus formed in the join and reduce the mechanical and electrical load-bearing capacity of the joint layer.

Some providers incorporate polymers for example epoxides, in the solder or metal powder, wherein the polymers also contain the flux. The polymers fill the cavities and, as adhesive, also improve the adhesion between the joint partners. A disadvantage here is the fact that the thermal resistance of the joint layer is increased again by the polymers, and the polymers are not stable at higher temperatures.

The object of the present invention is to produce stable joins between power electronics modules, said joins being devoid of the above-mentioned disadvantages.

In accordance with the invention, the paste, besides the solder and the metal powder, comprises a flux-free binder or a binder that comprises a flux having only low activation.

In the method according to the invention, the paste, once mixed, is pressed using a template or a screen onto a substrate or a base plate or another component of an electric power module. Alternatively, the paste can be painted on or sprayed on. The first component provided with the paste is joined to a second component, wherein the second component is advantageously pressed onto the first component, more specifically in such a way that the contact points between the first and second component comprise the region to which the paste has been applied. The solder powder is then melted in a first melting step. To this end, the bonding device for joining the first and second component may comprise a hot tool, which melts the solder powder in the paste under application of a pressure. A plurality of components can thus be preassembled in succession on a substrate.

During the first melting step, the solder partly wets a metallisation, which may or may not be provided, of the first and/or second component and fixes the metal powder on the metallisation. The applied pressure leads to a precompression of the powder mixture and to a further compaction during the melting step. Since the binder does not comprise any flux or comprises a flux having low activation, the liquid solder can initially be prevented from wetting the metal powder and immediately forming solid bridges formed of intermetallic phases between the individual particles of the metal powder. The paste thus initially remains capable of compaction since a solid structure is not formed.

The paste and the method for joining electronic components with the aid of the paste enable the production of a joint layer between the first and second component, said layer having low thermal resistance, high temperature change resistance and high temperature stability. A considerable improvement compared to lead-free soft solders is thus achieved. The join is also characterised by a lower costs compared to joins that have been produced using solders containing gold or using sintered silver. Due to the fact that the solder powder does not immediately wet the particles of the metal powder during the melting step, a join can be created between a first and a second component in such a way that the remelted paste arranged in the joint gap is present substantially without cavities and pores, such that the quality of the join between the components is drastically improved.

Further embodiments of the method or the paste will be described in the dependent claims and/or hereinafter.

In one embodiment of the paste, the solder powder comprises tin, indium or gallium as a solder base. Alternatively, the solder powder may contain a mixture of various solder bases, such as tin and indium or tin and bismuth. For example, SnCu, SnIn, SnZn, SnSb, Sn100, SnAg and SnAgCu are possible tin-based solders. Examples of indium-based solders may include AgIn and CuIn, or examples of gallium-based solders may include CuGa, NiGa and AgGa. In some solder systems, such as SnBi or BiIn, only one element of the solder powder forms an intermetallic phase, whilst the further element does not pass through such a phase formation, whereby the melting point of the paste can be increased, although only to a limited extent, as in the case of bismuth for example, with a melting point of 271° C.

Advantages of solders based on tin, indium or gallium are the good availability and the low costs associated with the acquirement of the solder powder.

In a further exemplary embodiment, the metal powder comprises copper, silver, nickel, palladium, platinum or gold, alone or as an alloy partner. For example, CuSn, CuMn, CuAl, CuZn, NiFe, AgPd and CuAg can be used as suitable alloys. Of the metals or alloys thereof mentioned here, copper-based metal powders are advantageous in particular, since here both the economical factors and the formation of the intermetallic phases progress advantageously. For example, the intermetallic phases are passed through in a short period of time.

In the case of the use of a flux-free binder, this comprises, in a further embodiment, at least one alcohol, one alkane or one phenol. If the binder uses an alcohol, such as a monovalent or polyvalent alcohol, the viscosity of the paste can be easily adjusted. In this case, the viscosity is selected in such a way that the paste can be easily applied, for example by printing, stamping or dispensing, and in such a way that the alcohols volatilise, without residue where possible, during the aforementioned first melting process. The action of reducing agents is only desirable to a limited extent, specifically to such an extent that there is sufficient adhesion of the solder material between the first and second component and the metal powder having a high melting point remains bound. At this stage, a porous filling in the joint gap is actually desirable so as to allow the influx of a gaseous reducing agent. Alternatively or in combination with the alcohols as binder, higher-valency alkanes or phenols can also be used as binders.

Generally, in this application, a flux is to be understood to mean an agent having surface-reducing properties, that is to say an agent that is suitable for dissolving oxide layers on metals. In contrast thereto, a flux-free binder or the constituents of the binder that are not fluxes, has/have no reducing properties.

A binder with mildly activatable flux is preferably understood to be a binder having a flux of type L0. This type is defined in standard IPC J-STD-004. Fluxes that demonstrate stronger activation than the activation of the L0 type are not used in accordance with the invention or occur only in small quantities or traces.

The proportion by weight of the flux in the binder is preferably less than 5% by wt., particularly preferably less than 3% by wt. Of this proportion, preferably less than 20% (that is to say less than 1% by wt. or 0.6% by wt. of the total binder) is formed by flux of a type different from L0. The flux particularly preferably merely comprises traces of a type other than L0, such that reference can be made on the whole to a low activatable flux. In this case, traces are understood to mean low quantities of flux of a type other than L0, such that the low quantity can reduce the metal powder of the solder not over the entire area, but merely in a locally limited manner. In other words, the flux demonstrates no reducing effect during the application of a pressure to the electronic component or power component in the first remelting phase.

In the case of the use of a binder having a mildly activatable flux, rosin is preferred as flux, in particular pure rosin. Although the binder, contrary to the case described previously, comprises a flux, this merely results in a slow dissolution of an oxide in the case of a mildly activatable agent, such that a wetting of the metal power by the solder is prevented in the first melting step.

It is preferable if the paste comprises merely the solder powder, the metal powder and the binder, which is either flux-free or comprises merely a flux having low activation. In particular, this means that the three main components form 100% by wt. of the paste before the first heating process.

In a further embodiment, the solder powder and the metal powder have a ratio by weight between 25% by wt:75% by wt. and 80% by wt:20% by wt. The ratio between solder powder and metal powder is generally selected such that it approximates the composition of the desired intermetallic phase. However, an excess of solder is advantageous in order to obtain improved filling of the cavities. An excess of metal powder having a high melting point leaves behind metal inclusions in the joint layer and reduces the proportion of remaining solder residues, which otherwise may still be present locally due to the random powder distribution.

In a further embodiment, the proportion of the binder is present in a ratio to the sum of the solder and metal powder in a ratio by weight of 2% by wt:98% by wt. up to 25% by wt:75% by wt. The viscosity of the paste and the flow behaviour of the melted solder can thus be influenced actively.

In a further embodiment, the ratio of metal powder, solder powder and binder is selected in such a way that the produced paste has a melting point of more than 200° C., preferably of more than 300° C., such that the temperatures occurring in the field of high-power electronics do not lead to a dewetting of the solder.

The paste is preferably used to join various components in the field of power electronics. In this case, the paste can be used to join a power semiconductor and a substrate or a substrate and a base plate.

In this case, it is advantageous in particular if the substrate, the semiconductor or the base plate comprise a metallisation corresponding to the metal powder of the paste. In the case of the first melting process, the metallisation is thus wetted by the solder such that the metal powder of the paste is fixed. Since the binder comprises no flux or only a mildly activatable flux however, the liquid solder is prevented however from wetting the particles of the metal powder and immediately forming solid bridges formed from intermetallic phases. The paste thus remains capable of compaction.

In one embodiment of the method, after the first heating of the first and second component, wherein the solder powder in the paste is melted and the metal powder is fixed, the first component with the second component already joined is then heated in a second step in a furnace, where appropriate under active atmosphere, for example formed from formic acid, and is remelted again. The metal powder and the solder surface are thus reduced, wherein the metal powder is then wetted largely completely by the solder and a conversion into intermetallic phases takes place. The degree of the transformation is dependent on the metal powder size, the soldering temperature, the soldering time and the metal powder proportion. An incomplete conversion may also be continued and completed by a subsequent thermal precipitation.

A mean particle size between 1 μm, preferably 3 μm, and 50 μm, preferably 30 μm, is preferably selected as the particle size for the metal powder.

Whereas, during the first heating of the first and second component, the components are affixed to one another, in the case of a second melting process, a reduction of oxide layers usually present is implemented between the first and second melting processes. Gaseous reducing agents can potentially be used as reducing agents since they can penetrate deep into the porous joint gap so as to reduce the oxide layers there. For example, hydrogen, carbon monoxide or gaseous organic acids, such as formic acid or acetic acid, are suitable typical reducing reaction gases. The reaction time until the oxide layers are reduced is dependent on the reducing gas, the temperature, the oxide, and the size of the pores in the joint layer. The reaction time advantageously ranges from a few minutes to a number of hours, wherein it must be taken into consideration that metal oxides have rather differing reducing capabilities: whereas copper oxides and silver oxides can be reduced easily, the reduction of nickel is much more difficult.

In the case of the second melting of the solder, the metal powders having a high melting point and the respective joint surfaces of the first and second component are wetted and the cavities are filled to the greatest possible extent with the liquid solder. The reaction between the solder and the metal powder having a high melting point leads, with renewed melting, to the formation of intermetallic phases and to a consumption of the solder. If the solder is largely converted, the remelting point is shifted to high temperatures, wherein low residual quantities of the solder powder lead merely to local melting, which, due to the formed structure of intermetallic phase for joining the first and second component, does not abruptly impair the mechanical and electrical properties however.

Due to the used paste according to the invention, it is possible to join the first and second component by means of a joint layer, wherein the joint layer has merely local cavities. Local cavities are preferably to be understood in such a way that preferably less than 5 vol. %, particularly preferably less than 3 vol. %, of the joint layer is formed by cavity inclusions, wherein 100 vol. % describes the volume of the joint gap between the first and second component or describes the total volume of the joint layer inclusive of the cavity inclusions. In other words, the joint layer consists of a proportion of more than 95 vol. % or more than 97 vol. % of the molten metal powder, solder powder and constituents of the metallisation of the first or second component. A filling of the cavities, for example with a polymer, is not necessary.

The invention will be explained hereinafter in greater detail on the basis of some specific examples. In this case, FIG. 1 shows a system formed from a first and second component, wherein the first and second component are joined to one another via a joint layer.

The joint layer consists of the constituents of a paste according to the invention remaining after a remelting process, that is to say it consists of the metal powder and solder powder and also traces of the binder and, where applicable, of the mildly activatable flux. The traces are constituents that have not volatilised during the remelting process.

EXAMPLE 1

A variant of the paste according to the invention consists of a solder powder, a metal powder and a mixture of various alcohols. The solder powder is SnAg4Cu0.5. The metal powder is Cu and is present in the form of small balls having a diameter of approximately 10 μm. The mixture uses various alcohols as binders, wherein, in the present case, butanol and terpineol are mixed together in a ratio of 1:2. The binder comprises no flux or solid constituents thereof. The paste does not comprise any further constituents.

After the mixing process, the solder and metal powder are present in a ratio by weight of 60:40. In other words, of the combination of solder and metal powder, 60% by wt. is formed by the tin-based solder, and 40% by wt. is formed by the copper.

The paste of Example 1 is then impressed onto a substrate of ceramic base and a metallisation formed from copper, and an IGBT chip having a copper metallisation over the entire surface is placed onto the substrate using a hot tool of the bonding device and is pressed on under application of a pressure. The heat and the pressure cause the tin-based solder powder to melt. In so doing, the solder partly wets the metallisations of the substrate and of the IGBT chip, whereby the copper powder is fixed. Since the binder does not comprise any flux, the liquid tin-based solder is prevented from wetting the copper balls and immediately forming solid bridges formed from intermetallic phases. In the case of different stacks of structural elements, such as a base plate, substrate and power module, the individual structural elements can be preassembled in succession. After the first melting process, the ceramic-based substrate is heated with the preassembled IGBT chip in a furnace under active atmosphere and remelted again. The copper and the tin-based solder are thus reduced, wherein the copper balls are then wetted largely completely by the tin-based solder and are converted into copper/tin-based intermetallic phases. During the second melting process, the cavities between the copper balls are filled largely with solder. A joint layer between the substrate and the IGBT chip is produced as a result and also as a result of the formation of the intermetallic phases, and comprises only local cavities. The mechanical and electrical properties are not significantly impaired however. In this case, local cavities are preferably to be understood in such a way that they account for less than 5 vol. %, particularly preferably less than 3 vol. %, of the joint gap. The remaining 95 vol. % (or 97 vol. %) of the joint gap or the joint layer is filled with the copper and the solder constituents and is filled at the upper edge with the constituents of the metallisation. A polymer filling of the cavities is not provided.

The joint layer produced between the first and second component is illustrated in FIG. 1. IGBT chip 1 with the metallization 2 is applied to the ceramic substrate 3, wherein the paste has been pressed onto the substrate before the first and second remelting processes. After the above-described remelting processes, the illustrated joint layer 4 is produced, which is formed from or consists of the copper and the solder constituents. The joint layer 4 is characterised by the low proportion of cavity inclusions 5, wherein the cavity inclusions 5 calculated on the basis of the volume of the joint gap account for less than 5 vol. %. The volume of the joint gap is defined by the height H and the area F of the component, that is to say H*F corresponds to 100 vol. % of the gap. In this case, the joint layer may account for less than 100 vol. % of the joint gap. In this case, the 5 vol. % of cavity inclusions are based on the joint layer inclusive of cavity inclusions. A filling of the cavity inclusions, for example with a polymer, is not necessary since the stability of the joint layer itself is sufficient.

EXAMPLE 2

The composition of the paste corresponds to that of Example 1, except for the fact that the metal powder consists of silver balls (Ag particles) (or alternatively of a mixture of Cu and Ag particles), and a proportion of 3% by wt. of rosin is incorporated in the binder.

Further variations of Examples 1 and 2 can be produced by changing the percentage proportions of solder powder and metal powder as described in the general part of the application.

The paste and the method for applying the paste are suitable in particular for the formation of electronic modules, in particular in the field of power electronics, and for the assembly of semiconductors or power semiconductors on DCB substrates and of DCB substrates on the base plate. Modules of this type are used in cars for electromobility, in systems for power transmission, and for connection of high powers. Components of this type can be used in modules for high-temperature electronics and sensor technology. In a further application, the modules can be used for lighting engineering, for example in LED modules or in electronic ignition systems.

The invention claimed is:

1. A paste for joining components of electronic power modules, comprising
   a solder powder and a metal powder, wherein a binder binds the solder powder and the metal powder before a heating process,
   wherein the binder volatizes during the heating process and wherein the binder is free from flux.

2. The paste according to claim 1, wherein the solder powder comprises tin, indium or gallium as a solder base or contains a mixture of tin, indium or bismuth.

3. The paste according to claim 1, wherein the metal powder comprises copper, silver, nickel, palladium, platinum or gold.

4. The paste according to claim 1, wherein the flux-free binder comprises at least one alcohol, one alkane or one phenol.

5. The paste according to claim 1, wherein the solder powder and the metal powder are present in a ratio by weight to one another from 25% by wt.:75% by wt. up to 80% by wt.:20% by wt.

6. The paste according to claim 1, wherein the binder and the sum of the solder powder and metal powder are present in a ratio by weight to one another from 2% by wt.:98% by wt. up to 25% by wt.:75% by wt.

7. The paste according to claim 1, wherein a mean particle size of the metal powder is between 1 µm and 50 µm.

8. The paste according to claim 1, wherein said paste has a melting point of more than 200° C.

9. Utilizing a paste according to claim 1 for joining a power semiconductor and a substrate or a substrate and a base plate.

10. A method for joining components of electric power modules by means of a paste according to claim 1, wherein the method comprises the following steps:
   a) applying the paste to a region of a first component:
   b) pressing a second component onto the region to which paste has been applied, and melting the solder powder.

11. The method according to claim 10, wherein the first and second component are heated under active atmosphere, wherein the constituents of the paste are remelted and the binder volatizes.

12. The method according to claim 10, wherein, after a reduction of a surface of the paste, said the paste is again melted.

13. A system produced from a first and second component with an intermediate joint layer utilizing a paste according to claim 1, wherein a remelted joint layer comprises merely local cavity inclusions.

14. A paste for joining components of electronic power modules, comprising
   a solder powder and a metal powder, wherein a binder binds the solder powder and the metal powder before a heating process,
   wherein the binder comprises a flux having low activation and the proportion by weight of the flux in the binder is less than 5% by wt., and
   wherein the solder powder and the metal powder are present in a ratio by weight to one another from 25% by wt.:75% to 80% by wt.:20% by wt.

15. The paste according to claim 14, wherein when the binder comprises a flux less than 20% by wt. of the flux is of a type other than L0.

16. The paste according to claim 14, wherein the binder comprises rosin.

* * * * *